(12) United States Patent
Hung

(10) Patent No.: US 10,796,770 B2
(45) Date of Patent: Oct. 6, 2020

(54) SENSING CIRCUIT OF MEMORY DEVICE AND ASSOCIATED SENSING METHOD

(71) Applicant: MACRONIX INTERNATIONAL CO., LTD., Hsinchu (TW)

(72) Inventor: Chun-Hsiung Hung, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/222,196

(22) Filed: Dec. 17, 2018

(65) Prior Publication Data

US 2020/0194085 A1 Jun. 18, 2020

(51) Int. Cl.
*G11C 16/04* (2006.01)
*G11C 16/26* (2006.01)
*G11C 11/56* (2006.01)
*G11C 16/30* (2006.01)
*G11C 16/08* (2006.01)

(52) U.S. Cl.
CPC .......... *G11C 16/26* (2013.01); *G11C 11/5642* (2013.01); *G11C 16/08* (2013.01); *G11C 16/30* (2013.01); *G11C 16/0408* (2013.01)

(58) Field of Classification Search
CPC .................................................... G11C 16/26
USPC .................................................... 365/185.21
See application file for complete search history.

(56) References Cited

U.S. PATENT DOCUMENTS

| 8,565,038 | B2* | 10/2013 | Tran ........................ | G11C 5/147 365/210.11 |
| 2006/0114733 | A1* | 6/2006 | Hosono ................... | G11C 16/26 365/206 |
| 2011/0170332 | A1* | 7/2011 | Oh .......................... | G11C 5/145 365/148 |
| 2014/0056063 | A1* | 2/2014 | Kajigaya ................ | G11C 7/067 365/182 |

* cited by examiner

*Primary Examiner* — Hoai V Ho
(74) *Attorney, Agent, or Firm* — McClure, Qualey & Rodack, LLP

(57) ABSTRACT

A sensing circuit, a sensing method and a memory device are provided. The sensing method is applied to the memory device having the sensing circuit. The sensing circuit includes a compensation source and a sensing module. The compensation source is capable of providing a compensating current to a first node during a read cycle. The sensing module is coupled to the first node. A cell of the memory device is coupled to the first node. The cell is capable of generating a cell current during the read cycle, and the sensing module determines that the cell is in a first storing state or a second storing state in response to a relationship between the compensating current and the cell current.

11 Claims, 5 Drawing Sheets

SENSING CIRCUIT OF MEMORY DEVICE AND ASSOCIATED SENSING METHOD

FIELD OF THE INVENTION

The present invention relates to a sensing circuit and a sensing method, and more particularly to a sensing circuit of a memory device and an associated sensing method.

BACKGROUND OF THE INVENTION

As is well known, a non-volatile memory device such as NAND flash memory device or NOR flash memory device is widely used in a variety of electronic devices. Generally, the NAND flash memory device or the NOR flash memory device includes a memory array, the memory array includes plural cells, and the cells are NAND cells or NOR cells. Each cell includes a floating gate transistor. The floating gate transistor of each cell has a floating gate to store hot carriers.

Depending on the hot carriers to be stored in the cell, the cells may be classified into plural types. A single-level cell (SLC) can store only one bit of data per cell. A multi-level cell (MLC) can store two bits of data per cell. In other words, each single-level cell (SLC) has two storing states and each multi-level cell (MLC) has four storing states. An example of the single-level cell (SLC) having two storing states, namely an "on" state and an "off" state, will be described as follows.

During a read cycle of the non-volatile memory device, a cell current (also referred as a read current) is generated. According to the magnitude of the cell current, the storing state (e.g., an "on" state or an "off" state) of the cell may be realized.

For example, if the cell is in the "on" state, the cell generates a higher cell current during the read cycle. Whereas, if the cell is in the "off" state, the cell generates a lower cell current during the read cycle. That is, during the read cycle, the on-state cell may generate a higher cell current, but the off-state cell may generate a lower cell current.

Moreover, the non-volatile memory device further includes a sensing circuit for receiving the cell current from the cell, thereby determining the storing state of the cell.

SUMMARY OF THE INVENTION

An embodiment of the present invention provides a sensing circuit of a memory device. The sensing circuit includes: a compensation source capable of providing a compensating current to a first node during a read cycle and a sensing module coupled to the first node. A cell of the memory device is coupled to the first node. The cell is capable of generating a cell current during the read cycle, and the sensing module determines that the cell is in a first storing state or a second storing state in response to a relationship between the compensating current and the cell current.

Another embodiment of the present invention provides a sensing method applied to a sensing circuit including a compensation source coupled a first node. The sensing method includes steps of: activating a word line signal of a cell and controlling the cell coupled to the first node during a read cycle; precharging the first node to a supply voltage during a first phase of the read cycle; activating the compensation source for providing a compensating current to the first node during a second phase of the read cycle so that the first node starts to discharge; coupling a second node with the first node during a third phase of the read cycle so that the second node shares charges with the first node; and generating a data in response to a voltage of the second node during a fourth phase of the read cycle.

Still another embodiment of the present invention provides a memory device including plural first transistors, plural cells and a sensing circuit. The sensing circuit is coupled to the cells through the corresponding first transistors. The sensing circuit includes a current mirror and plural sensing modules. An adjustable current source of the current mirror is coupled to a first node. A first sensing module of the sensing circuit is coupled to the first node. Moreover, one of the plural first transistors is coupled between the first node and a first cell of the plural cells.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

According to the properties of the non-volatile memory device, during the read cycle, different magnitudes of the cell current (also referred as a read current) are generated according to the storing state of the cell. The present invention provides a sensing circuit of the non-volatile memory device for determining the storing state of the cell. Furthermore, the cells are NAND cells or NOR cells.

Figure 1A:
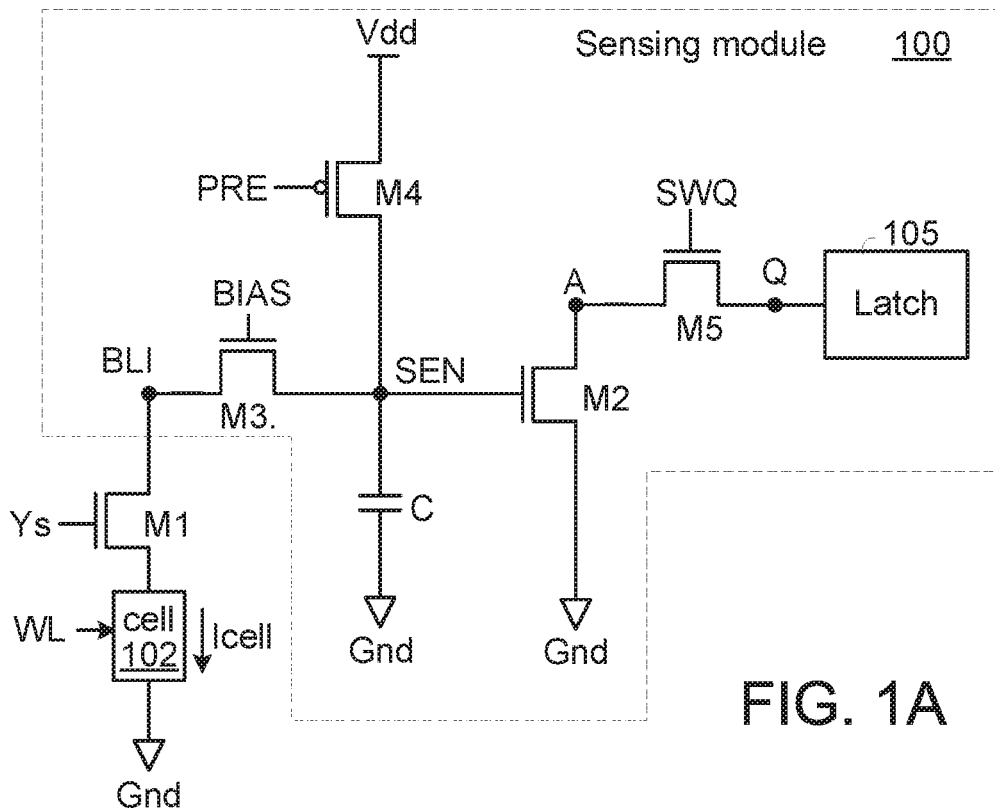
FIG. 1A is a schematic circuit diagram illustrating a sensing circuit of the memory device according to a first embodiment of the present invention.
Figure 1B:
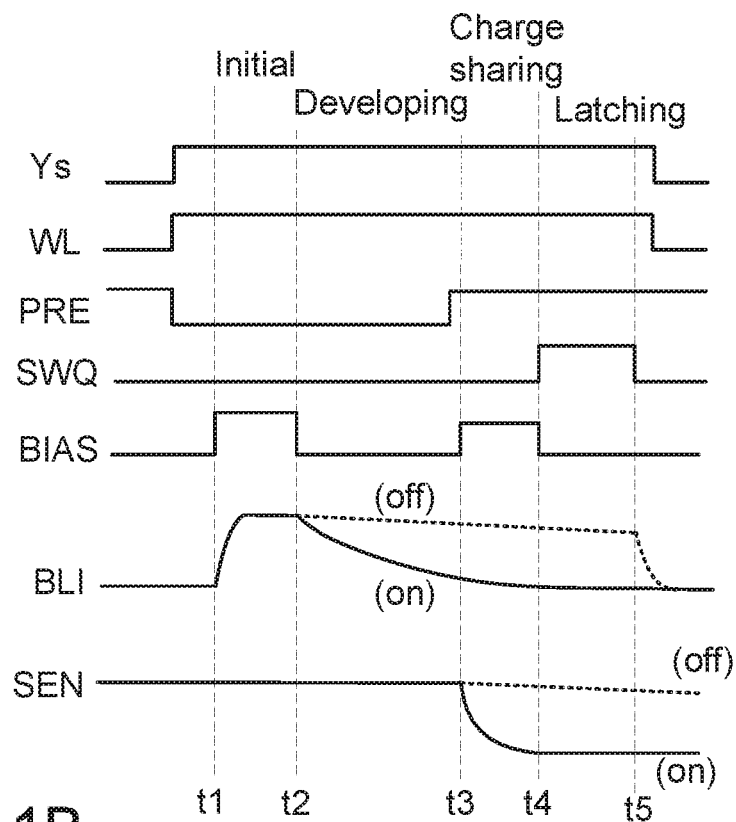
FIG. 1B is a schematic timing waveform diagram illustrating associated signals processed by the sensing circuit of FIG. 1A during the read cycle.

FIG. 1A is a schematic circuit diagram illustrating a sensing circuit of the memory device according to a first embodiment of the present invention. FIG. 1B is a schematic timing waveform diagram illustrating associated control signals processed by the sensing circuit of FIG. 1A during a read cycle.

The non-volatile memory device includes a cell 102, a transistor M1 and a sensing module 100. A first source/drain terminal of the transistor M1 is coupled to a first node BLI, a second source/drain terminal of the transistor M1 is coupled to a first terminal of the cell 102, and a gate terminal of the transistor M1 receives a first control signal Ys. A second terminal of the cell 102 is coupled to a ground terminal Gnd, and a control terminal of the cell 102 receives a word line signal WL. During the read cycle, when the first control signal Ys is activated, the cell 102 is coupled to a first node BLI. Furthermore, when the word line signal is activated, the cell 102 is capable of generating the cell current Icell.

In a first exemplary embodiment, the sensing circuit includes a sensing module 100. The sensing module 100 includes transistors M2, M3, M4 and M5, a capacitor C and a latch 105. A first source/drain terminal of the transistor M2 is coupled to a second node A, a second source/drain terminal of the transistor M2 is coupled to the ground terminal Gnd, and a gate terminal of the transistor M2 is coupled to a third node SEN. A first source/drain terminal of the transistor M3 is coupled to the first node BLI, a second source/drain terminal of the transistor M3 is coupled to the third node SEN, and a gate terminal of the transistor M3 receives a second control signal BIAS. A first source/drain terminal of the transistor M4 is coupled to a supply terminal Vdd, a second source/drain terminal of the transistor M4 is coupled to the third node SEN, and a gate terminal of the transistor M4 receives a third control signal PRE. A first source/drain terminal of the transistor M5 is coupled to the second node A, a second source/drain terminal of the transistor M5 is coupled to a fourth node Q and a gate terminal of the transistor M5 receives a fourth control signal SWQ. A first terminal of the capacitor C is coupled to the third node SEN, and a second terminal of the capacitor C is coupled to the ground terminal Gnd.

As shown in FIG. 1B, during the read cycle, both the first control signal Ys and the word line signal WL are activated, and the cell 102 is coupled to the first node BLI.

There are four phases during the read cycle. The first phase is an initial phase from the time point t1 to the time point t2. During the initial phase, the transistor M4 is turned on according to a lower voltage level of the third control signal PRE. Consequently, the third node SEN is precharged to the supply voltage Vdd. Also, the transistor M3 is turned on according to a higher voltage level of the second control signal BIAS. Consequently, the first node BLI is also charged to the supply voltage Vdd.

The second phase is a developing phase from the time point t2 to the time point t3. During the developing phase, the transistor M4 is still turned on, and the third node SEN is maintained at the supply voltage Vdd. However, the transistor M3 is turned off according to the lower voltage level of the second control signal BIAS. Consequently, the first node BLI starts to discharge according to the storing state of the cell 102. For example, as shown by the dotted line, if the cell 102 is in the "off" state, voltage of the first node BLI drops down at a slower discharging rate because of the lower cell current Icell. As shown by the solid line, if the cell 102 is in the "on" state, the voltage of the first node BLI drops down at a faster discharging rate because of the higher cell current Icell.

The third phase is a charge sharing phase from the time point t3 to the time point t4. During the charge sharing phase, the transistor M4 is turned off according to the higher voltage level of the third control signal PRE. The transistor M3 is turned on again according to the higher voltage level of the second control signal BIAS. Consequently, the third node SEN shares charges with the first node BLI. That is, the voltages of the first node BLI and the third node SEN drop down at a slower discharging rate (dotted line) if the cell 102 is in the "off" state. On the contrary, the voltages of the first node BLI and the third node SEN drop down at a faster discharging rate (solid line) if the cell 102 is in the "on" state.

The fourth phase is a latching phase from the time point t4 to the time point t5. During the latching phase, the transistor M5 is turned on according to a higher voltage level of the fourth control signal SWQ and hence the second node A is coupled to the fourth node Q. Moreover, the voltage of the third node SEN controls the transistor M2. For example, if the cell 102 is in the "off" state, the transistor M2 is turned on due to the higher voltage level of the third node SEN. Under this circumstance, the voltage of fourth node Q is discharged to the ground voltage Gnd, and then the latch 105 is capable of latching a data "0". On the contrary, if the cell 102 is in the "on" state, the transistor M2 is turned off due to the lower voltage level of the third node SEN. Under this circumstance, the voltage of the fourth node Q is not discharged, and then the latch 105 is capable of latching a data "1".

From the above discussions, the sensing module 100 of the sensing circuit is capable of detecting the storing state of the cell 102. The sensing module 100 determines that the storing state of the cell 102 is in the "off" state when the latch 105 latches the data "0". Furthermore, the sensing module 100 determines that the storing state of the cell 102 is in the "on" state when the latch 105 latches the data "1".

Ideally, a magnitude of the cell current Icell in the "off" state is much less than the magnitude of the cell current Icell in the "on" state. For example, the magnitude of the cell current Icell in the "off" state is around several nA, while the magnitude of the cell current Icell in the "on" state is twenty times of the magnitude of the cell current Icell in the "off" state. Under this circumstance, the sensing module 100 of the first embodiment can correctly detect the storing state of the cell 102.

However, the cell current Icell in the "off" state and the cell current Icell in the "on" state may not differ by one or two orders of magnitude. For example, if the magnitude of the cell current Icell in the "off" state is about 6 µA, and the magnitude of the cell current Icell in the "on" state is about 10 µA. Under this circumstance, the sensing module 100 may not distinguish the two discharging rates correctly; the sensing module 100 thus may erroneously detect the storing state of the cell 102.

Figure 2:
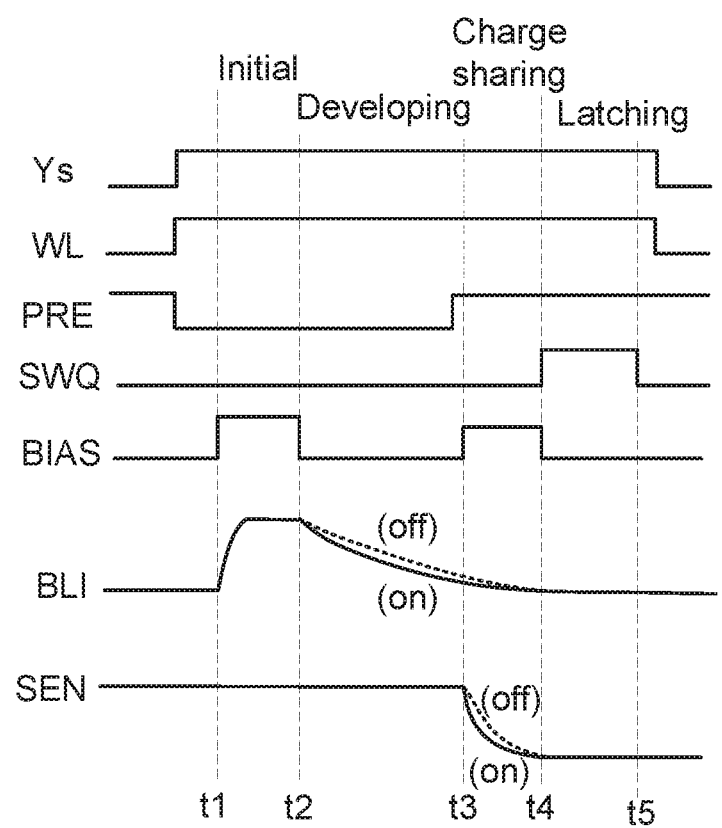
FIG. 2 is a schematic timing waveform diagram illustrating an example of erroneously detection processed by the sensing circuit of FIG. 1A during the read cycle.

FIG. 2 is a schematic timing waveform diagram illustrating an example of erroneously detection processed by the sensing circuit of FIG. 1A during the read cycle.

As shown in FIG. 2, if the magnitude of the cell current Icell in the "off" state is not much less than the magnitude of the cell current Icell in the "on" state, the discharging rates of the third node SEN in the "on" and "off" states are very similar during the charge sharing phase. Under this circumstance, the latch 105 always latches the data "1" during the latching phase regardless of the storing states of the cell 102.

Figure 3A:
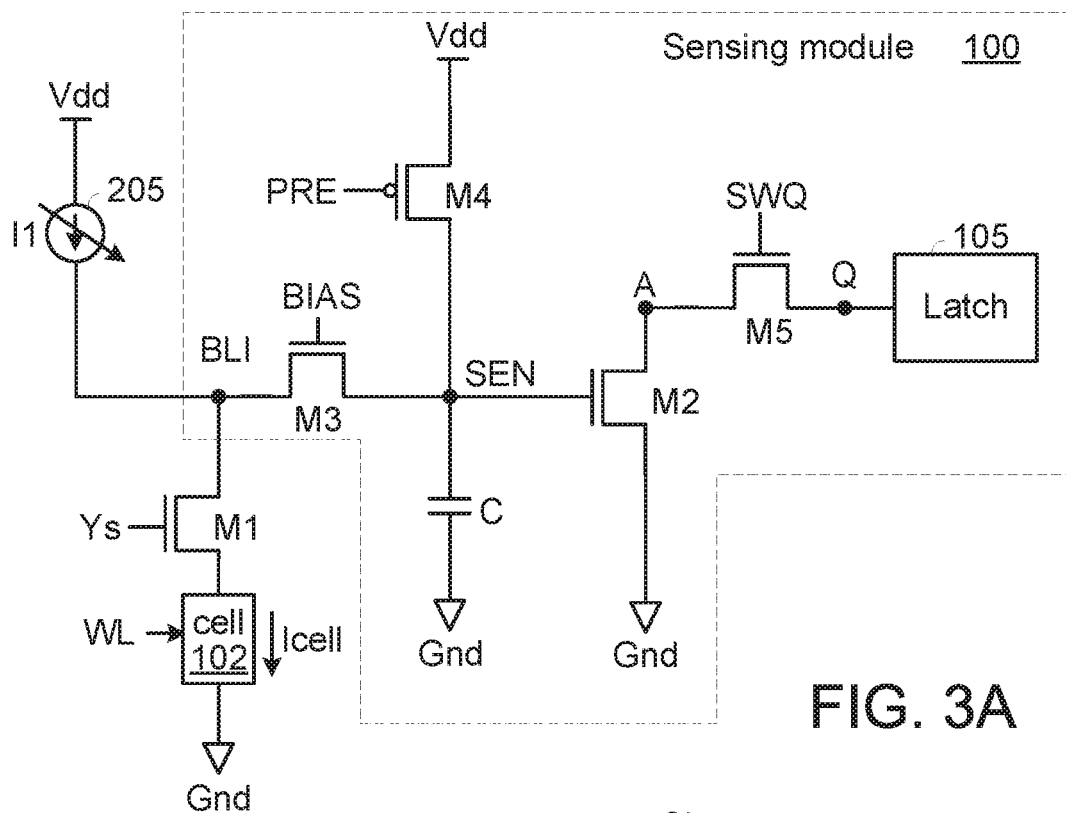
FIG. 3A is a schematic circuit diagram illustrating a sensing circuit of the memory device according to a second embodiment of the present invention.
Figure 3B:
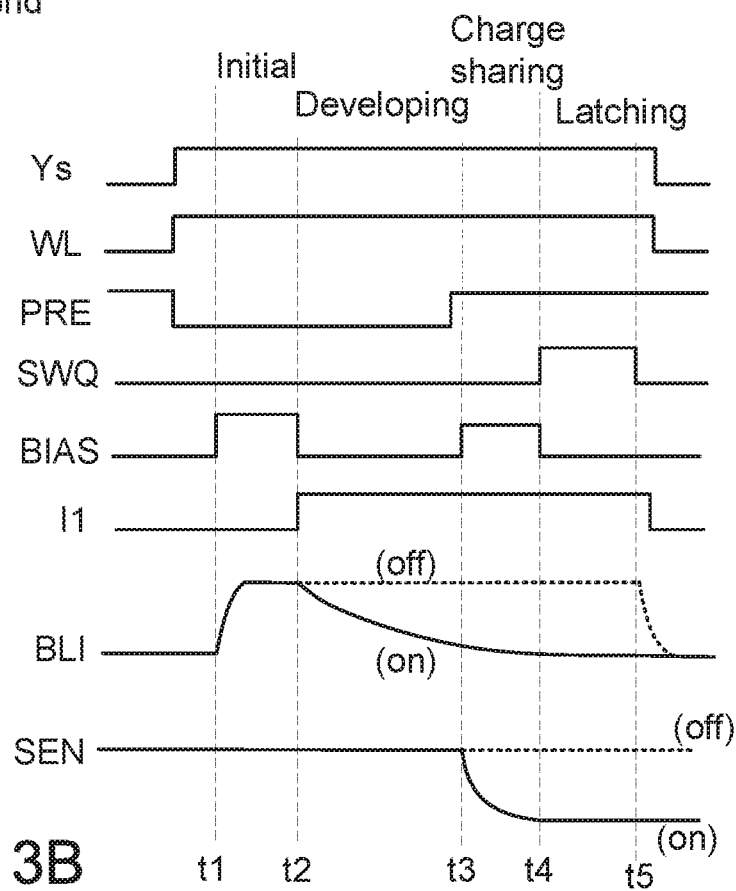
FIG. 3B is a schematic timing waveform diagram illustrating associated signals processed by the sensing circuit of FIG. 2A during the read cycle.

FIG. 3A is a schematic circuit diagram illustrating a sensing circuit of the memory device according to a second exemplary embodiment of the present invention. FIG. 3B is a schematic timing waveform diagram illustrating associated signals processed by the sensing circuit of FIG. 3A during the read cycle.

In comparison with the first exemplary embodiment, the sensing circuit of the second exemplary embodiment further includes a compensation source 205 that is coupled to the first node BLI of the sensing module 100 for providing a compensating current I1 during the read cycle. For example, the compensation source 205 is an adjustable current source.

As shown in FIG. 3B, there are four phases during the read cycle. The first phase is an initial phase from the time point t1 to the time point t2. During the initial phase, a transistor M4 is turned on according to a lower voltage level of a third control signal PRE. Consequently, a third node SEN is precharged to the supply voltage Vdd. Also, a transistor M3 is turned on according to a higher voltage level of the second control signal BIAS. Consequently, the first node BLI is charged to the supply voltage Vdd.

The second phase is a developing phase from the time point t2 to the time point t3. During the developing phase, the transistor M4 is still turned on, and the third node SEN is maintained at the supply voltage Vdd. However, the transistor M3 is turned off according to the lower voltage level of the second control signal BIAS. Additionally, the compensation source 205 is activated for providing the compensating current I1 to the first node BLI.

In accordance with the second exemplary embodiment of the present invention, the compensating current I1 is greater than the cell current Icell in the "off" state and less than the current cell in the "on" state. For example, if the magnitude of the cell current Icell in the "off" state is 6 μA, and the magnitude of the cell current Icell in the "on" state is 10 μA. Then, the magnitude of the compensating current I1 can be set according to the two current magnitudes. For example, set the magnitude of the compensating current I1 in a range greater than 6 μA and less than 10 μA. For instance, the magnitude of the compensating current I1 can be set as 8 μA. By providing the compensating current I1, determination about whether the cell is in the "on" state and the "off" state becomes more distinguishable.

As shown by the dotted line, if the cell 102 is in the "off" state, the cell current Icell discharges the electrons on the first node BLI, but at the same time the compensating current I1 provides sufficient electrons on the first node BLI. Consequently, the voltage of the first node BLI successfully keeps at the supply voltage Vdd. On the contrary, as shown by the solid line, if the cell 102 is in the "on" state, the compensating current I1 does not provide sufficient electrons on the first node BLI, so the voltage of the first node BLI drops down at a discharging rate because the cell current Icell is greater than the compensating current I1. Alternatively speaking, using of the compensation source 205 ensures the voltage of the first node BLI can truly reflect the storing state of the cell thereby maintaining the correctness of the read cycle.

The third phase is a charge sharing phase from the time point t3 to the time point t4. During the charge sharing phase, the transistor M4 is turned off according to the higher voltage level of the third control signal PRE. The transistor M3 is turned on again according to the higher voltage level of the second control signal BIAS. Also, the compensation source 205 is activated to provide the compensating current I1 to the first node BLI. Consequently, the third node SEN shares charges with the first node BLI. That is, the voltages of the first node BLI and the third node SEN successfully keep at the supply voltage Vdd (dotted line) if the cell 102 is in the "off" state. On the other hand, the voltages of the first node BLI and the third node SEN drop down at a discharging rate (solid line) if the cell 102 is in the "on" state.

The fourth phase is a latching phase from the time point t4 to the time point t5. During the latching phase, the transistor M5 is turned on according to a higher voltage level of the fourth control signal SWQ, and the second node A is coupled to the fourth node Q. Moreover, the voltage of the third node SEN controls the transistor M2. For example, if the cell 102 is in the "off" state, the transistor M2 is turned on in response to the supply voltage Vdd of the third node SEN. Under this circumstance, the voltage of fourth node Q is discharged to the ground voltage Gnd, and then the latch 105 is capable of latching a data "0". On the contrary, if the cell 102 is in the "on" state, the transistor M2 is turned off in response to a lower voltage level of the third node SEN. Under this circumstance, the voltage of the fourth node Q is not discharged, and then the latch 105 is capable of latching a data "1".

From the above discussions, the sensing circuit further includes a compensation source 205 providing a compensating current I1 during the read cycle to prevent erroneous detection. In this way, the sensing module 100 can correctly determines that the cell is in the "on" state or the "off" state by applying the compensating current I1. In other words, the sensing module 100 can correctly determines that the cell is in the "on" state or the "off" state in response to a relationship between the compensating current I1 and the cell current Icell. In other words, the sensing module 100 is capable of correctly detecting the storing state of the cell 102 even if magnitudes of the cell currents in the "on" state and the "off" state do not differ significantly (for example, difference between the cell current in the "on" state and the "off" state is less than one orders of magnitude) and/or when orders (scales) of the cell current Icell in the "off" state and the cell current Icell are relatively high, for example, with a μA-level current scale. That is, when the latch 105 latches the data "0", the sensing module 100 determines that the storing state of the cell 102 is in the "off" state. Furthermore, when the latch 105 latches the data "1", the sensing module 100 determines that the storing state of the cell 102 is in the "on" state.

In the above embodiment, the sensing circuit is capable of determining two storing states of the single-level cell. However, those skilled in the art will readily observe that numerous modifications and alterations may be made while retaining the teachings of the invention.

Figure 4:
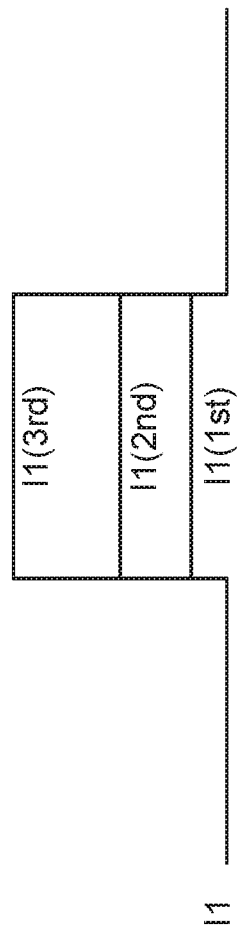
FIG. 4 shows different compensating currents I1 provided by the compensation source for detecting MLC cell.

For example, FIG. 4 shows different compensating currents I1 provided by the compensation source. In another embodiment, the compensation source 205 is an adjustable current source that provides different compensating currents to the first node BLI during different read cycles to detect multi-level (MLC) cell. For example, the compensating current I1 has three different levels I1 (1st), I1 (2nd) and I1 (3rd) for three read cycles. During the first read cycle, the compensating current I1 having the first level I1 (1st) is provided to the first node BLI. During the second read cycle, the compensating current I1 having the second level I1 (2nd) is provided to the first node BLI. During the third read cycle, the compensating current I1 having the third level I1 (3rd) is provided to the first node BLI. Therefore, the sensing module 100 is capable of determining plural storing states of the multi-level (MLC) cell.

Figure 5:
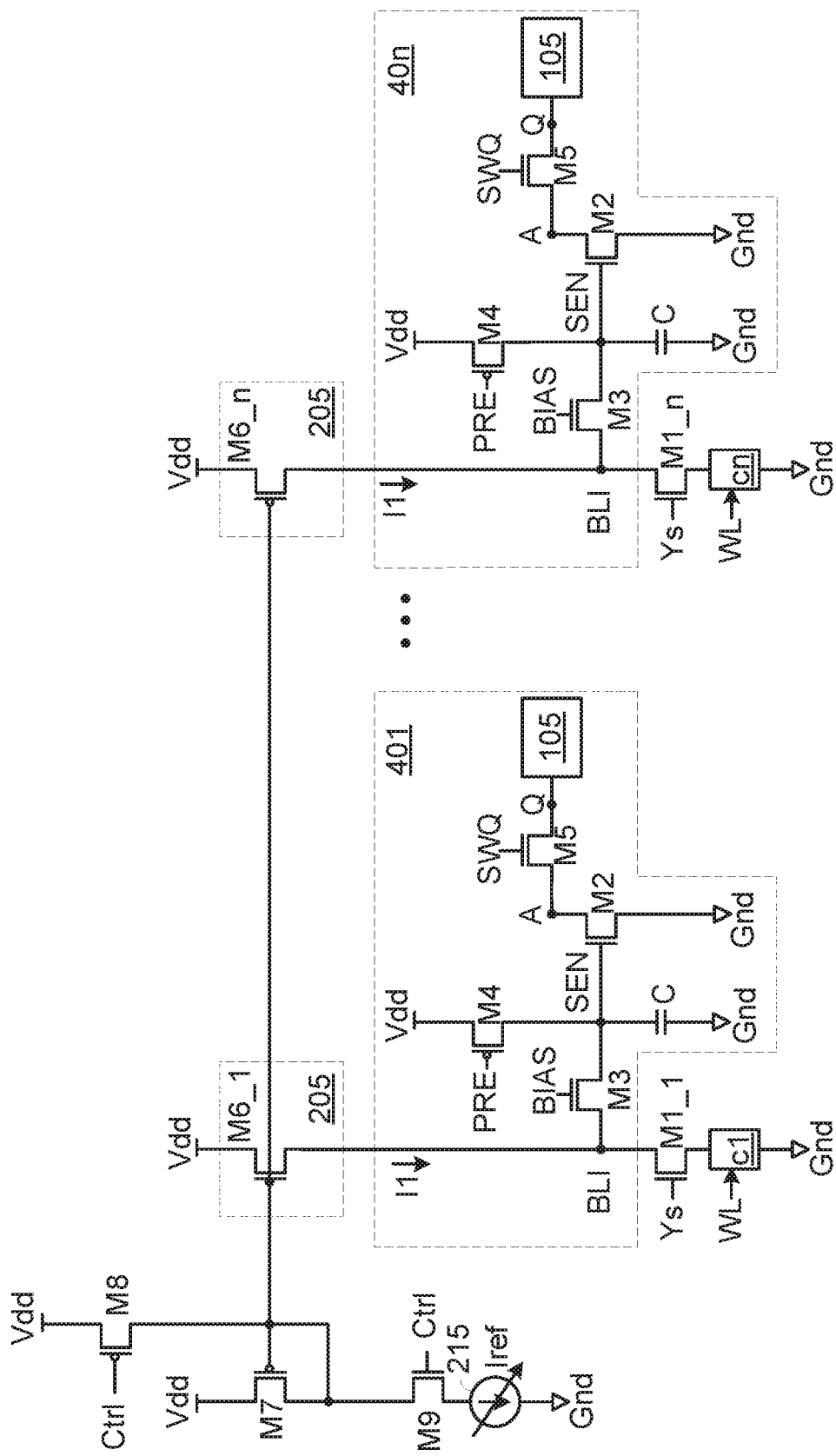
FIG. 5 is a schematic circuit diagram illustrating a sensing module capable of simultaneously determining the storing states of plural cells of the memory device according to a third embodiment of the present invention.

FIG. 5 is a schematic circuit diagram illustrating a sensing circuit capable of simultaneously determining the storing states of a plurality of cells of the memory device according to a third exemplary embodiment of the present invention.

The sensing circuit is coupled to n cells c1~cn through the corresponding transistors M1_1~M1_n. Furthermore, the sensing circuit includes a current mirror and n sensing modules 401~40n. The sensing modules 401~40n are similar to the sensing module 100 of the second exemplary embodiment and hence are not redundantly described herein.

The current mirror includes transistor M7~M9 and M6_11~M6_n. A first source/drain terminal of the transistor M7 is coupled to the supply terminal Vdd, a second source/drain terminal of the transistor M7 is coupled to a gate terminal of the transistor M7. A first source/drain terminal of the transistor M8 is coupled to the supply terminal Vdd, a second source/drain terminal of the transistor M8 is coupled to the gate terminal of the transistor M7 and a gate terminal of the transistor M8 receives a fifth control signal Ctrl. A first source/drain terminal of the transistor M9 is coupled to the gate terminal of the transistor M7, a second source/drain terminal of the transistor M9 is coupled to a reference current source 215 and a gate terminal of the transistor M9 receives the fifth control signal Ctrl. The reference current source 215 is coupled between the second terminal of the transistor M9 and the ground terminal Gnd.

Furthermore, the configurations of the transistors M6_1~M6_n form n compensation sources 205 of the sensing circuit. For example, a first source/drain terminal of the transistor M6_1 is coupled to the supply terminal Vdd, a second source/drain terminal of the transistor M6_1 is coupled to the first node BLI, and a gate terminal of the transistor M6_1 is coupled to the gate terminal of the transistor M7.

In accordance with the third exemplary embodiment of the present invention, the transistor M8 is turned off, and the transistor M9 is turned on when the fifth control signal Ctrl is activated during the developing phase and the charge sharing phase. Consequently, the reference current Iref and the compensating currents I1 are generated and the magnitude of the reference current Iref is proportional to the magnitude of the compensating current I1. In this way, n latches 105 generate n latched data during the latching phase. Also, n storing states of the cell c1~cn can be simultaneously determined according to n latched data.

From the above discussions, the present invention discloses a sensing circuit of a memory device. The sensing circuit includes a compensation source capable of providing a compensating current I1 to compensate the cell current during the read cycle. According to the embodiment of the present invention, the sensing module determines that the cell is in the "on" state when the magnitude of the compensating current I1 is less than the magnitude of the cell current, and the sensing module determines that the cell is in the "off" state when the magnitude of the compensating current I1 is greater than the magnitude of the cell current. In this way, the sensing circuit can correctly detect the storing state of the cell.

It is noted that implementation of the sensing module of the sensing circuit is not limited to the embodiment mentioned above. Alternatively, in some other embodiments, a similar sensing circuit may include a compensation source and another sensing module to achieve the sensing circuit of the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A sensing circuit of a memory device, comprising:
   a cell, coupled to a first node, wherein the cell is a NAND cell or a NOR cell;
   a first transistor;
   a compensation source capable of providing a compensating current to the first node during a read cycle; and
   a sensing module coupled to the first node, comprising:
   a second transistor, wherein a first source/drain terminal of the second transistor is coupled to a second node, a second source/drain terminal of the second transistor is coupled to a ground terminal, and a gate terminal of the second transistor is coupled to a third node;
   a third transistor, wherein a first source/drain terminal of the third transistor is coupled to the first node, a second source/drain terminal of the third transistor is coupled to the third node, and a gate terminal of the third transistor receives a second control signal;
   wherein the cell is capable of generating a cell current during the read cycle, and the sensing module determines that the cell is in a first storing state or a second storing state in response to a relationship between the compensating current and the cell current.

2. The sensing circuit as claimed in claim 1, wherein the cell is a single-level cell.

3. The sensing circuit as claimed in claim 2, wherein a magnitude of the compensating current is less than a first cell current generated by the single-level cell in a first storing state, and the magnitude of the compensating current is greater than a second cell current generated by the single-level cell in a second storing state.

4. The sensing circuit as claimed in claim 3, wherein the sensing module determines that the cell is in the first storing state when a voltage of the first node is maintained at a supply voltage, and the sensing module determines that the cell is in the second storing state when the voltage of the first node is discharged to a ground voltage.

5. The sensing circuit as claimed in claim 1, wherein the cell is a multi-level cell, and the compensation source is capable of providing plural compensating currents to the first node during plural read cycles.

6. The sensing circuit as claimed in claim 1, wherein a first source/drain terminal of the first transistor is coupled to the first node, a second source/drain terminal of the first transistor is coupled to a first terminal of the cell, a gate terminal of the first transistor receives a first control signal, a second terminal of the cell is coupled to the ground terminal, and a control terminal of the cell receives a word line signal.

7. The sensing circuit as claimed in claim 1, wherein the compensation source is an adjustable current source coupled between a supply terminal and the first node.

8. The sensing circuit as claimed in claim 7, wherein the sensing module further comprises:
   a fourth transistor, wherein a first source/drain terminal of the fourth transistor is coupled to the supply terminal, a second source/drain terminal of the fourth transistor is coupled to the third node, and a gate terminal of the fourth transistor receives a third control signal;
   a capacitor, wherein a first terminal of the capacitor is coupled to the third node, and a second terminal of the capacitor is coupled to the ground terminal;
   a fifth transistor, wherein a first source/drain terminal of the fifth transistor is coupled to the second node, a second source/drain terminal of the fifth transistor is coupled to a fourth node, and a gate terminal of the fifth transistor receives a fourth control signal; and
   a latch coupled to the fourth node.

9. A sensing method applied to a sensing circuit including a compensation source coupled a first node, wherein the sensing method comprises steps of:
- activating a word line signal of a cell and controlling the cell coupled to the first node during a read cycle, wherein the cell is a NAND cell or a NOR cell;
- during a first phase of the read cycle, precharging the first node to a supply voltage;
- during a second phase of the read cycle, activating the compensation source for providing a compensating current to the first node, so that the first node starts to discharge;
- during a third phase of the read cycle, coupling a second node with the first node, so that the second node shares charges with the first node; and
- during a fourth phase of the read cycle, generating a data in response to a voltage of the second node.

10. The sensing method as claimed in claim 9, wherein during the fourth phase, first transistor is controlled by the voltage of the second node, wherein the voltage of a third node is discharged to a ground voltage if the first transistor is turned on, and the voltage of the third node is not discharged to the ground voltage if the first transistor is turned off.

11. The sensing method as claimed in claim 10, further comprising steps of:
- determining that the cell is in the first storing state if the voltage of the third node is discharged to the ground voltage; and
- determining that the cell is in the second storing state if the voltage of the third node is not discharged to the ground voltage.

* * * * *